United States Patent
Ishiguro et al.

(10) Patent No.: US 9,484,478 B2
(45) Date of Patent: Nov. 1, 2016

(54) SOLAR CELL MODULE

(71) Applicant: SANYO Electric Co., Ltd., Osaka (JP)

(72) Inventors: Tasuku Ishiguro, Osaka (JP);
Masanori Maeda, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 1 day.

(21) Appl. No.: 14/592,973

(22) Filed: Jan. 9, 2015

(65) Prior Publication Data

US 2015/0114464 A1    Apr. 30, 2015

Related U.S. Application Data

(63) Continuation of application No. PCT/JP2012/071559, filed on Aug. 27, 2012.

(51) Int. Cl.
*H01L 31/046* (2014.01)
*H01L 31/048* (2014.01)
*H01L 31/0224* (2006.01)
*H01L 31/05* (2014.01)
*H01L 31/054* (2014.01)

(52) U.S. Cl.
CPC ... *H01L 31/0481* (2013.01); *H01L 31/022433* (2013.01); *H01L 31/048* (2013.01); *H01L 31/0508* (2013.01); *H01L 31/0547* (2014.12); *Y02E 10/52* (2013.01)

(58) Field of Classification Search
CPC .............. H01L 31/0461; H01L 31/048; H01L 31/022433; H01L 31/0508; H01L 31/0547
USPC ........................................................ 136/244
See application file for complete search history.

(56) References Cited

U.S. PATENT DOCUMENTS

| | | | | |
|---|---|---|---|---|
| 6,353,042 B1* | 3/2002 | Hanoka | ............. | B32B 17/10678 136/251 |
| 2011/0253191 A1* | 10/2011 | Kutzer | ................ | H01L 31/0504 136/244 |
| 2011/0277834 A1* | 11/2011 | Hatakeyama | ......... | H01L 31/048 136/256 |
| 2013/0125952 A1* | 5/2013 | Sumitomo | .......... | H01L 31/0508 136/244 |

FOREIGN PATENT DOCUMENTS

| | | |
|---|---|---|
| JP | 2009-278011 A | 11/2009 |
| JP | 2010-021595 A | 1/2010 |
| JP | 2011-216804 A | 10/2011 |
| JP | WO 2011/162248 | * 12/2011 |
| WO | 2012086590 A1 | 6/2012 |

* cited by examiner

*Primary Examiner* — Jayne Mershon
(74) *Attorney, Agent, or Firm* — Mots Law, PLLC

(57) ABSTRACT

A second protective member faces a first protective member. A bonding layer is disposed between the first and the second protective member. A solar cell includes a first main surface facing a side of the first protective member and a second main surface facing a side of the second protective member. A wiring member disposed on the second main surface. The bonding layer includes a first bonding layer disposed between the first protective member and the solar cell and made of a transparent resin a second bonding layer disposed between the second protective member and the solar cell and made of a colored resin, and a third bonding layer disposed between the second bonding layer and the solar cell and made of a transparent resin, and the second bonding layer is in contact with a main surface of the wiring member on a side of the second protective member.

12 Claims, 4 Drawing Sheets

SOLAR CELL MODULE

CROSS REFERENCE TO RELATED APPLICATIONS

This application is a continuation application of International Application No. PCT/JP2012/071559, filed on Aug. 27, 2012, entitled "SOLAR CELL MODULE", the entire contents of which are incorporated herein by reference.

TECHNICAL FIELD

The invention relates to solar cell modules.

BACKGROUND

Conventionally, a solar cell module having a solar cell provided within a bonding layer disposed between a light-receiving surface side protective member and a back surface side protective member is known. For example, an example of such solar cell module is described in Patent Document 1. In a solar cell described in Patent Document 1, a bonding layer includes a light-receiving surface side bonding layer disposed between a light-receiving surface side protective member and a solar cell and a back surface side bonding layer disposed between a back surface side protective member and a solar cell. The light-receiving surface side bonding layer is formed of a transparent resin. On the other hand, a portion of the back surface side bonding layer on the side of the back surface side protective member is formed of a colored resin, and a portion thereof on the side of the solar cell is formed of a transparent resin.

Patent Document 1: Japanese Patent Application Publication No. 2011-216804

SUMMARY OF THE INVENTION

A solar cell module described in Patent Document 1 has a problem that output characteristics are likely to vary over time.

A solar cell module according to an embodiment includes a first protective member, a second protective member, a bonding layer, a solar cell, and a wiring member. The second protective member faces the first protective member at a distance. The bonding layer is disposed between the first protective member and the second protective member. The solar cell is disposed within the bonding layer. The solar cell includes a first main surface, and a second main surface. The first main surface is oriented toward the first protective member. The second main surface is oriented toward the second protective member. The wiring member is disposed on the second main surface of the solar cell. The wiring member contains Cu. The bonding layer includes a first bonding layer, a second bonding layer, and a third bonding layer. The first bonding layer is disposed between the first protective member and the solar cell. The first bonding layer is made of a transparent resin. The second bonding layer is disposed between the second protective member and the solar cell. The second bonding layer is made of a colored resin. The third bonding layer is disposed between the second bonding layer and the solar cell. The third bonding layer is made of a transparent resin. The second bonding layer is in contact with a main surface of the wiring member on the side of the second protective member.

DETAILED DESCRIPTION

Figure 1:
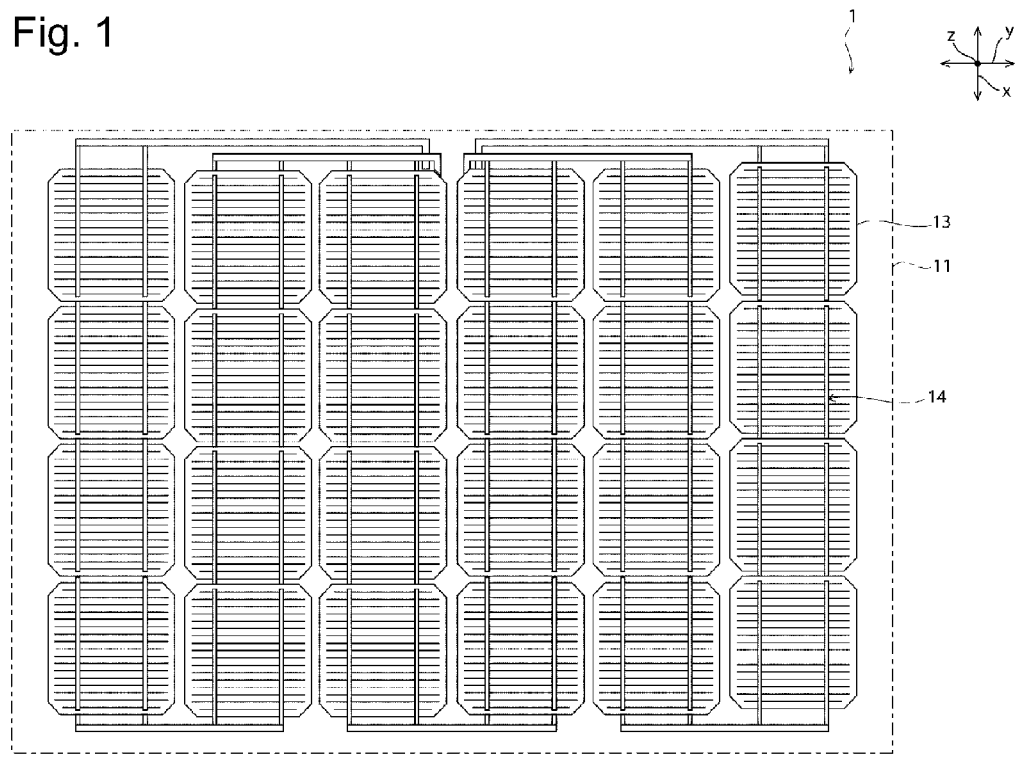
FIG. 1 is a schematic plan view of a solar cell module according to one embodiment.

Hereinafter, embodiments of solar cell modules are described. Note that the embodiment described below is merely illustrative, and the invention is not limited to the embodiment described below in any way.

In the drawings referred to for the embodiment and the like, a member having substantially the same function is referred to with the same reference numeral. The drawings referred to for the embodiment and the like are schematically illustrated, and the dimension ratio and the like of an object drawn in the drawings may be different from those of a real object. The dimension ratio and the like of an object may be different between the drawings. The dimension ratio and the like of a specific object should be determined by considering description given below.

Figure 2:
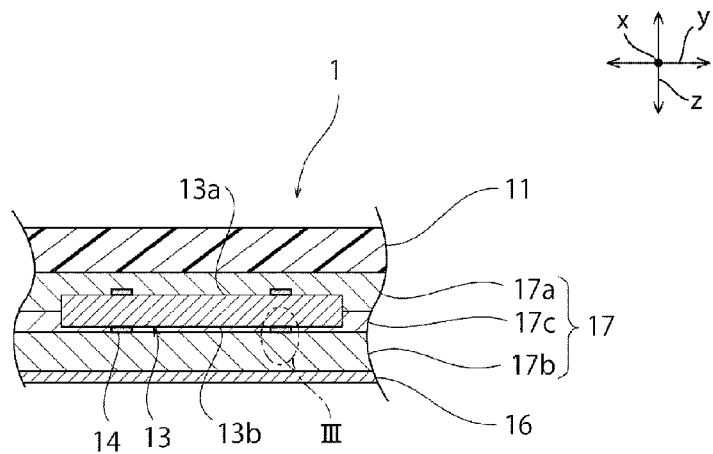
FIG. 2 is a schematic cross-sectional view of the solar cell module according to the one embodiment.

As illustrated in FIG. 2, solar cell module 1 includes first protective member 11 and second protective member 16. First protective member 11 may be formed of, for example, a glass sheet. Second protective member 16 faces first protective member 11 at a distance. Second protective member 16 is formed of, for example, a resin sheet made of polyethylene terephthalate (PET), polyvinyl fluoride resin (PVF), polyvinylidene fluoride (PVDF), or a combination thereof or the like. Second protective member 16 may be made of a resin sheet, or a resin sheet including a barrier layer such as a metal layer and an inorganic oxide layer. The oxygen permeability of second protective member 16 is higher than the oxygen permeability of first protective member 11.

Sealant 17 is disposed between first protective member 11 and second protective member 16. Solar cell 13 is disposed within the sealant 17. Solar cell 13 is disposed in such a manner that light-receiving surface 13a as a first main surface is oriented toward first protective member 11, and back surface 13b as a second main surface is oriented toward second protective member 16. Note that light-receiving surface 13a is one of the first and second main surfaces of solar cell 13, that has relatively high amount of incident light, and back surface 13b is one that has relatively low amount of incident light.

Solar cell 13 includes first electrode 13d disposed on light-receiving surface 13a, and second electrode 13c (see FIG. 3) disposed on back surface 13b. However, in the invention, the solar cell may be a back contact solar cell in which both first and second electrodes are disposed on one main surface (typically, back surface).

As illustrated in FIG. 1, solar cell module 1 includes a plurality of solar cells 13. The plurality of solar cells 13 are electrically connected to each other by metallic wiring member 14. Specifically, first electrode of one solar cell out of adjacent solar cells 13 and second electrode 13c of the other solar cell are electrically connected to each other by wiring member 14.

Figure 3:
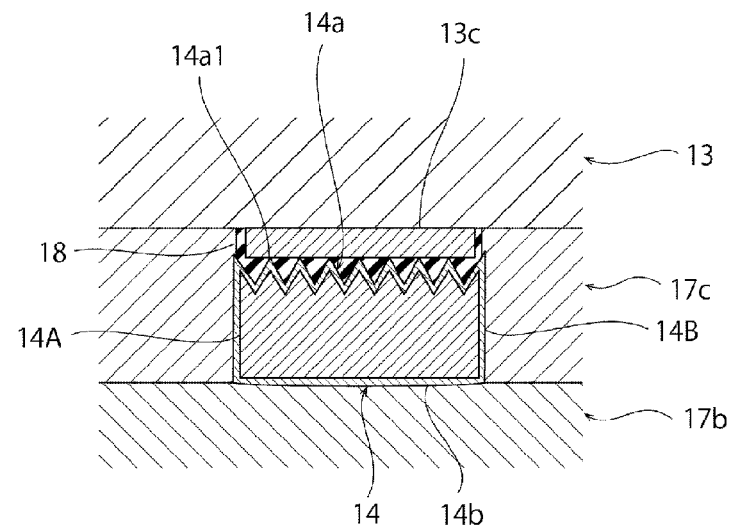
FIG. 3 is a schematic cross-sectional view of a portion III in FIG. 2.

As illustrated in FIG. 3, wiring member 14 and solar cell 13 are bonded to each other by resin adhesive layer 18 containing a cured resin adhesive. Resin adhesive layer 18 may be formed of, for example, a resin only. In this case, wiring member 14 is preferably bonded by resin adhesive layer 18 while in contact with an electrode of solar cell 13. Resin adhesive layer 18 may be formed of, for example, a resin containing a conductive material. In this case, wiring member 14 and solar cell 13 may be electrically connected by the conductive material.

Wiring member 14 contains copper (Cu). Specifically, wiring member 14 includes wiring member body 14A and coating layer 14B. Wiring member body 14A of wiring member 14 is made of copper or copper alloy. Specific examples of the copper alloy include, for example, a Cu—Fe—Ni alloy and the like. Wiring member body 14A is coated with coating layer 14B. Coating layer 14B does not contain Cu substantially. Coating layer 14B may be formed of, for example, silver or a silver alloy. Specific examples of the silver alloy include, for example, Ag—Bi alloy and the like. Thickness of coating layer 14B may be, for example, about 0.1 µm to 100 µm.

Wiring member 14 includes first main surface 14a and second main surface 14b. Wiring member 14 is disposed in such a manner that first main surface 14a is oriented toward first protective member 11 and second main surface 14b is oriented toward second protective member 16. Irregularities 14a1 are provided on first main surface 14a. Specifically, a plurality of irregularities 14a1 extending in a direction where wiring member 14 extends is provided on first main surface 14a. For this reason, light passing through first protective member 11 and being incident on wiring member 14 is irregularly reflected on first main surface 14a and efficiently guided onto light-receiving surface 13a of solar cell 13. Size of apex angle in a transverse section of irregularity 14a1 is preferably, for example, about 120° to 150°.

On the other hand, second main surface 14b is formed of a flat surface. Here, the flat surface means a surface not having a plurality of irregularities. The flat surface includes, for example, a convex surface or a concave surface curved with a curvature radius larger than the width of wiring member 14.

Wiring member 14 having first main surface 14a including irregularities may be fabricated, for example, by pressing a flat plate-shaped base material having flat main surfaces on both sides thereof. In general, in wiring member 14 fabricated by pressing, thickness of portions of coating layer 14B above corner portions of wiring member body 14A is thinner than the other portions. The thickness of portions of coating layer 14B above corner portions of wiring member body 14A is often less than ½ of the thickness of the other portions thereof.

Bonding layer 17 includes first bonding layer 17a, second bonding layer 17b, and third bonding layer 17c. First bonding layer 17a, third bonding layer 17c, and second bonding layer 17b are disposed in this order from the side of first protective member 11 to the side of second protective member 16. First bonding layer 17a is disposed between first protective member 11 and solar cell 13. First bonding layer 17a is in contact with a surface of first protective member 11 on the side of solar cell 13, and light-receiving surface 13a of solar cell 13. First bonding layer 17a may or may not cover at least a portion of a side face of solar cell 13.

Second bonding layer 17b is disposed between solar cell 13 and second protective member 16. Second bonding layer 17b is in contact with a surface of second protective member 16 on the side of solar cell 13. Second bonding layer 17b is not in contact with back surface 13b of solar cell 13.

Third bonding layer 17c is disposed between second bonding layer 17b and solar cell 13. Third bonding layer 17c is in contact with a surface of second bonding layer 17b on the side of solar cell 13 and back surface 13b of solar cell 13.

Each of first bonding layer 17a and third bonding layer 17c is formed of a transparent resin. Specifically, first bonding layer 17a and third bonding layer 17c contain a crosslinkable resin such as ethylene vinyl acetate copolymer (EVA) or a non-crosslinkable resin such as polyolefin, but do not substantially contain pigment or dye. Note that the transparent resin includes a transparent resin composition.

Second bonding layer 17b is formed of a colored resin. Specifically, second bonding layer 17b contains, for example, pigment or dye, in addition to a crosslinkable resin such as ethylene vinyl acetate copolymer (EVA) or a non-crosslinkable resin such as polyolefin. With this configuration, light entering solar cell module 1 through first protective member 11 is reflected on a surface of second bonding layer 17b and guided to solar cell 13 efficiently. Thus, improved output characteristics can be obtained. Second bonding layer 17b is preferably made of a white resin containing a white pigment such as titanium dioxide particles. In this case, optical reflectance on a surface of second bonding layer 17b may be enhanced. Accordingly, more improved output characteristics can be obtained.

Third bonding layer 17c is disposed between first bonding layer 17a and second bonding layer 17b. This configuration suppresses movement of second bonding layer 17b onto light-receiving surface 13a during fabrication of solar cell module 1. Accordingly, more improved output characteristics can be achieved.

Figure 4:
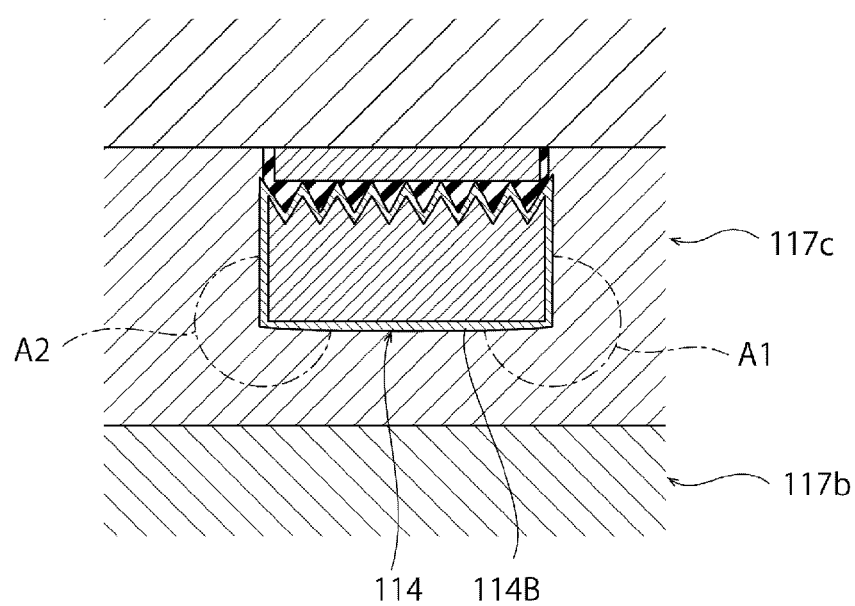
FIG. 4 is a schematic cross-sectional view of a portion of a solar cell module according to a comparative example.

Meanwhile, as illustrated in FIG. 4, it is conceivable that wiring member 114 is disposed entirely within third bonding layer 117c made of a transparent resin and second bonding layer 117b is arranged apart from wiring member 114. However, as a result of intensive studies, the inventors found that in third bonding layer 117c, portions A1 and A2 located in the vicinity of corner portions of wiring member 114 on the side of protective member 116 discolor over time. Specifically, portions A1 and A2 are colored in brown over time. This lowers light transmittance of portions A1 and A2, and thereby reduces light utilization efficiency. As a result, output characteristics of solar cell module 1 deteriorate.

Coloration of portions A1 and A2 in brown over time may be possibly caused by the fact that copper in wiring member 114 is dispersed into bonding layer 117 due to oxygen existing in bonding layer. Local discoloration of portions A1 and A2 in the vicinity of corner portions of wiring member 114 on the side of protective member 16 may be possibly caused by the fact that coating layer 114B is thin at the corner portions.

Here, in solar cell module 1, second bonding layer 17b is in contact with second main surface 14b which is a main surface of wiring member 14 on the side of protective member 16. Since second bonding layer 17b is a colored and light-reflecting layer, light utilization efficiency does not deteriorate so much even if second bonding layer 17b is discolored. Therefore, change of output characteristics of solar cell module 1 over time can be suppressed. Specifically, deterioration of output characteristics of solar cell module 1 over time can be suppressed.

Figure 5:
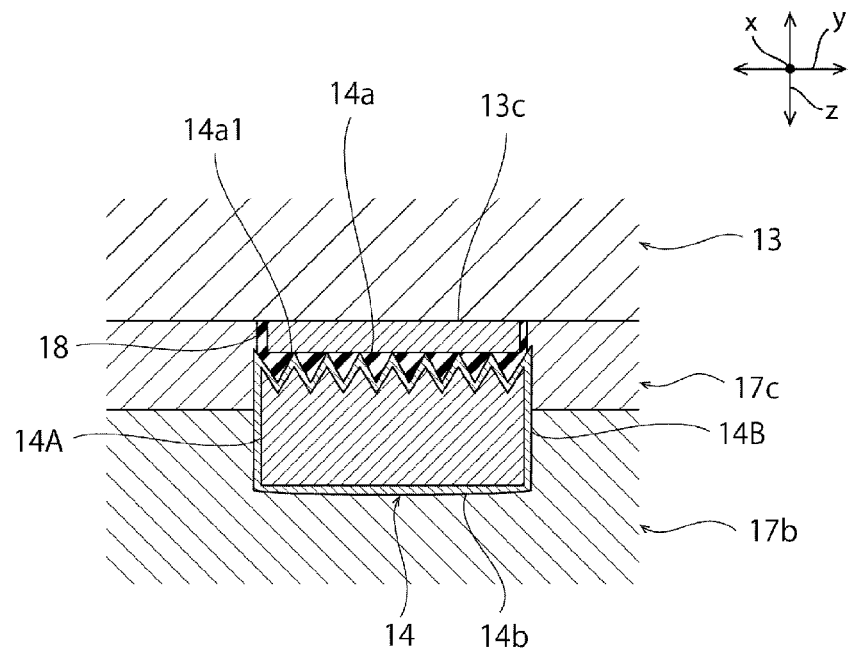
FIG. 5 is a schematic cross-sectional view of a portion of a solar cell module according to a first modification.
Figure 6:
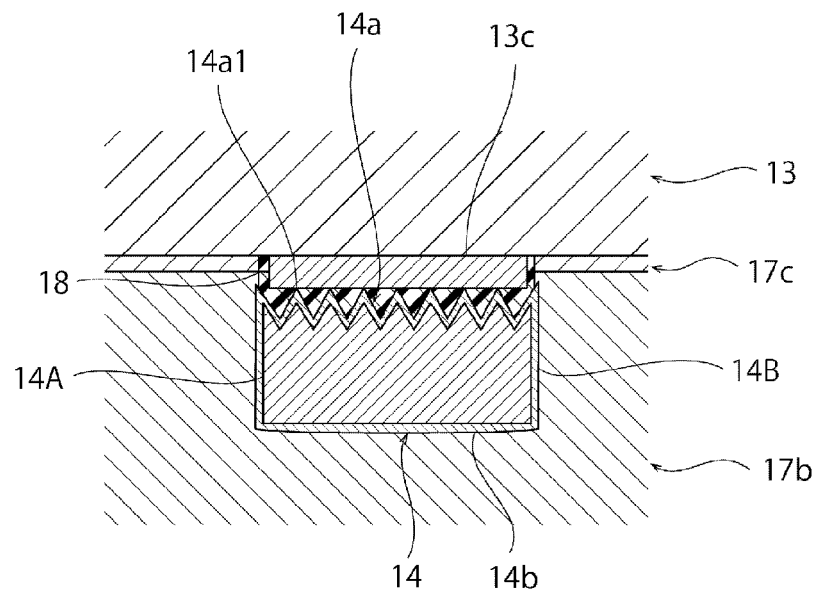
FIG. 6 is a schematic cross-sectional view of a portion of a solar cell module according to a second modification.

In the light of suppressing deterioration of output characteristics of solar cell module 1 over time, second bonding layer 17b may be in contact with second main surface 14b of wiring member 14. In solar cell module 1, second main surface 14b and a surface of second bonding layer 17b are substantially flush with each other. However, for example, as illustrated in FIG. 5 and FIG. 6, at least a portion of wiring member 14 may be located within second bonding layer 17b In a modification illustrated in FIG. 5, a portion of wiring member 14 is located within second bonding layer 17b. Corner portions of wiring member 14 on the side of second main surface 14b are located within second bonding layer 17b, while corner portions of wiring member 14 on the side of first main surface 14a are located within third bonding layer 17c. In a modification illustrated in FIG. 6, wiring member 14 is located entirely within second bonding layer 17b.

Existence of oxygen may be a possible cause of the discoloration of bonding layer 17. For this reason, discoloration of bonding layer 17 is unlikely to occur on the side of first protective member 11 made of glass and having low oxygen permeability, while discoloration of bonding layer 17 is likely to occur on the side of second protective member 16 formed of a resin sheet and having high oxygen permeability. In particular, discoloration of bonding layer 17 is more likely to occur on the side of second protective member 16 when second protective member 16 is formed of a resin sheet not having a barrier layer such as a metal layer and an inorganic oxide layer. Accordingly, it is especially effective to provide second bonding layer 17b in contact with second main surface 14b of wiring member 14.

(Method of Manufacturing Solar Cell Module 1)

Figure 7:
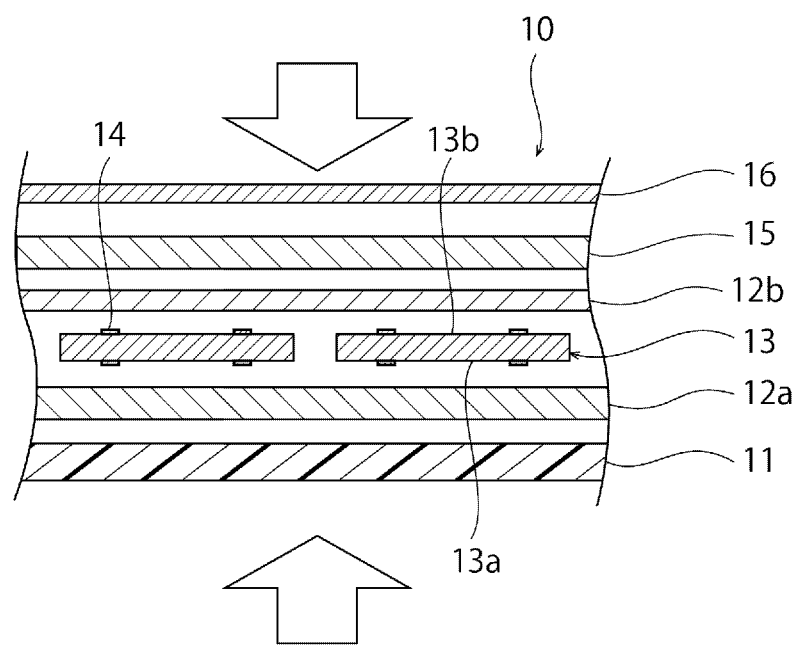
FIG. 7 is a schematic exploded cross-sectional view of a laminate according to an embodiment.

Solar cell module 1 may be manufactured, for example, according to the following procedure. Firstly, laminate 10 illustrated in FIG. 7 is fabricated. Specifically, laminate 10 is fabricated by stacking first protective member 11, first transparent resin sheet 12a, solar cell 13 with wiring member 14, second transparent resin sheet 12b, colored resin sheet 15, and second protective member 16 in this order. First transparent resin sheet 12a is a resin sheet for forming first bonding layer 17a. Second transparent resin sheet 12b is a resin sheet for forming third bonding layer 17c. Colored resin sheet 15 is a resin sheet for forming second bonding layer 17b.

Next, laminate 10 is pressurized while being heated (heating press process). Thus, solar cell module 1 can be completed. In the heating press process, second transparent resin sheet 12b is disposed between colored resin sheet 15 and solar cell 13 to suppress flowing of colored resin sheet 15 onto light-receiving surface 13a of solar cell 13.

In the heating press process, heating temperature of laminate 10 may be, for example, about 100° C. to 160° C., and is preferably about 130° C. to 150° C. Heating temperature of laminate 10 may be, for example, about 125° C.

In this way, the embodiments described above provide solar cell modules with output characteristics unlikely to vary over time.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

The invention claimed is:

1. A solar cell module comprising:
a first protective member;
a second protective member facing the first protective member at a distance;
a bonding layer disposed between the first protective member and the second protective member;
a solar cell disposed within the bonding layer, the solar cell having a first main surface facing a side of the first protective member and a second main surface facing a side of the second protective member; and
a wiring member disposed on the second main surface of the solar cell and containing Cu, wherein
the bonding layer includes:
a first bonding layer portion disposed between the first protective member and the solar cell and made of a transparent resin;
a second bonding layer portion disposed between the second protective member and the solar cell and made of a resin that is colored; and
a third bonding layer portion disposed between the second bonding layer portion and the solar cell and made of a transparent resin,
in a cross section of the solar cell and the wiring member, the second bonding layer portion is in contact with a main surface of the wiring member on a side of the second protective member, and
in the cross section of the solar cell and the wiring member, the third bonding layer portion is in contact with a side surface of the wiring member.

2. The solar cell module according to claim 1, wherein the wiring member includes:
a wiring member body made of copper or a copper alloy; and
a coating layer covering the wiring member body and made of silver or a silver alloy.

3. The solar cell module according to claim 2, wherein a portion of the coating layer located on a corner of the wiring member body is thinner than other regions of the wiring member body.

4. The solar cell module according to claim 2, wherein the wiring member comprises a pressed base material with both main surfaces flat.

5. The solar cell module according to claim 1, wherein an irregularity is provided on the other main surface of the wiring member on a side of the first protective member, and the main surface on the side of the second protective member is flat.

6. The solar cell module according to claim 1, wherein at least a portion of the wiring member is within the second bonding layer portion.

7. The solar cell module according to claim 1, further comprising a resin adhesive layer bonding the solar cell and the wiring member to each other.

8. The solar cell module according to claim 1, wherein the first protective member is formed of a glass sheet, and the second protective member is formed of a resin sheet.

9. The solar cell module according to claim 1, wherein the second bonding layer portion comprises white pigment.

10. The solar cell module according to claim 9, wherein the white pigment is titanium dioxide.

11. The solar cell module according to claim 1, wherein the third bonding layer portion is in contact with the second main surface of the solar cell.

12. The solar cell module according to claim 1, wherein a distance between the main surface of the wiring member and the second protective member is equal to the thickness of the second bonding layer portion.

* * * * *